(12) United States Patent
Hou

(10) Patent No.: US 12,712,498 B2
(45) Date of Patent: Aug. 18, 2026

(54) SWITCHED RC NETWORK TO IMPROVE THE NOISE AND STABILITY OF A LOW-NOISE AMPLIFIER

(71) Applicant: Qorvo US, Inc., Greensboro, NC (US)

(72) Inventor: Bin Hou, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 17 days.

(21) Appl. No.: 19/048,036

(22) Filed: Feb. 7, 2025

(65) Prior Publication Data

US 2025/0266795 A1 Aug. 21, 2025

Related U.S. Application Data

(60) Provisional application No. 63/555,431, filed on Feb. 20, 2024.

(51) Int. Cl.
*H03F 3/19* (2006.01)
*H04B 1/04* (2006.01)
*H04B 1/40* (2015.01)

(52) U.S. Cl.
CPC ............. *H03F 3/19* (2013.01); *H04B 1/0475* (2013.01); *H04B 1/40* (2013.01); *H03F 2200/451* (2013.01)

(58) Field of Classification Search
CPC ... H03F 3/19; H03F 2200/451; H04B 1/0475; H04B 1/40
See application file for complete search history.

(56) References Cited

U.S. PATENT DOCUMENTS

| | | | | |
|---|---|---|---|---|
| 9,035,697 | B2 | 5/2015 | Youssef et al. | |
| 2014/0240048 | A1* | 8/2014 | Youssef | H03F 3/245 330/296 |
| 2018/0342988 | A1* | 11/2018 | Seshita | H03F 1/0205 |
| 2019/0081596 | A1* | 3/2019 | Dunworth | H03H 7/48 |

(Continued)

OTHER PUBLICATIONS

Andreani, P. et al., "Noise Optimization of an Inductively Degenerated CMOS Low Noise Amplifier," IEEE Transactions on Circuits and Systems—II: Analog and Digital Signal Processing, vol. 48, No. 9, Sep. 2001, IEEE, pp. 835-841.

(Continued)

*Primary Examiner* — Freshteh N Aghdam
(74) *Attorney, Agent, or Firm* — Withrow & Terranova, P.L.L.C.

(57) ABSTRACT

A radio frequency (RF) amplifier has a first transistor with a first gate coupled to a first input, and a first series-connected capacitor-resistor combination coupled between the first gate and a first source. A first shunt switch is in parallel with the first resistor and controlled by a first signal. A grounding switch is between the first gate and ground, controlled by a second signal. A controller commands the switches to select an on-state for amplification at the first input or off-state to prevent RF signal amplification. A second transistor with a second gate is coupled to a second input, and a second series-connected capacitor-resistor combination is coupled between the second gate and a second source. A second shunt switch is in parallel with the second resistor and controlled by a third signal. A grounding switch is between the first gate and ground and is controlled by a fourth signal.

30 Claims, 5 Drawing Sheets

(56) References Cited

U.S. PATENT DOCUMENTS

| | | | | |
|---|---|---|---|---|
| 2023/0090460 | A1 * | 3/2023 | Jiang | H03F 3/21 330/277 |
| 2023/0253893 | A1 | 8/2023 | Smith et al. | |

OTHER PUBLICATIONS

Deng, Z. et al., "On the Noise Optimization of CMOS Common-Source Low-Noise Amplifier," IEEE Transactions on Circuits and Systems—I: Regular Papers, vol. 58, No. 4, Apr. 2011, IEEE, pp. 654-667.

Jemilehin, T., "The Linear RC-Delay Model in the VLSI Design," Technical Article, All About Circuits, Nov. 2, 2020, available online: <url: https://www.allaboutcircuits.com/technical-articles/linear-rc-delay-model-vlsi-design/>, 6 pages.

* cited by examiner

SWITCHED RC NETWORK TO IMPROVE THE NOISE AND STABILITY OF A LOW-NOISE AMPLIFIER

RELATED APPLICATIONS

This application claims the benefit of provisional patent application Ser. No. 63/555,431, filed Feb. 20, 2024, the disclosure of which is hereby incorporated herein by reference in its entirety.

FIELD OF THE DISCLOSURE

The present disclosure relates to low-noise amplifiers fabricated in silicon-on-insulator technology, and more particularly to a common source stage low-noise amplifier with improved noise figure performance while maintaining stability over process, voltage, and temperature variations.

BACKGROUND

In related-art low-noise amplifiers (LNAs), it is common practice to share one common source degeneration inductor among different bands to save layout area. The LNA includes a first transistor and a second transistor, where only one of the two can be turned on at any given time. Additional capacitors are added between the gate and source node of the common source stage to improve noise figure performance and make input matching easier with noise figure and gain trade-offs. When the first transistor is turned on and the second transistor is turned off, a shunt switch shorts the gate of the second transistor to ground. Depending on the selection of transistor size and capacitance and inductance values, there is potential for stability issues at frequencies greater than 10 GHz when a network at the source of the first transistor becomes capacitive and presents an impedance with a negative real part at the gate of the first transistor. Therefore, there is a need for an LNA of similar structure with improved out-of-band high-frequency stability.

SUMMARY

The present disclosure relates to a radio frequency (RF) amplifier and a method for controlling the same. The RF amplifier comprises a first transistor with a first gate coupled to a first RF input, a first drain, and a first source. A series-connected combination of a first capacitor and a first resistor is coupled between the first gate and first source, with a first shunt switch coupled in parallel with the first resistor and configured to be controlled by a first shunting signal. Additionally, a first grounding switch is coupled between the first gate and ground and is configured to be controlled by a first grounding signal. Further included is a controller that is configured to select an on-state or an off-state for the first transistor by generating appropriate commands for the grounding and shunting signals.

The RF amplifier further comprises a second transistor with a second drain, a second source, and a second gate coupled to a second RF input. A series-connected combination of a second capacitor and a second resistor is coupled between the second gate and the second source, with a second shunt switch in parallel with the second resistor and controlled by a second shunting signal. Additionally, a second grounding switch is coupled between the second gate and ground, controlled by a second grounding signal. The controller is further configured to select the on-state and the off-state for the second transistor by generating the appropriate commands for the grounding and shunting signals. Embodiments of the present disclosure provide a low-noise amplifier that improves gain/noise match, maintains stability, and minimizes noise figure degradation.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
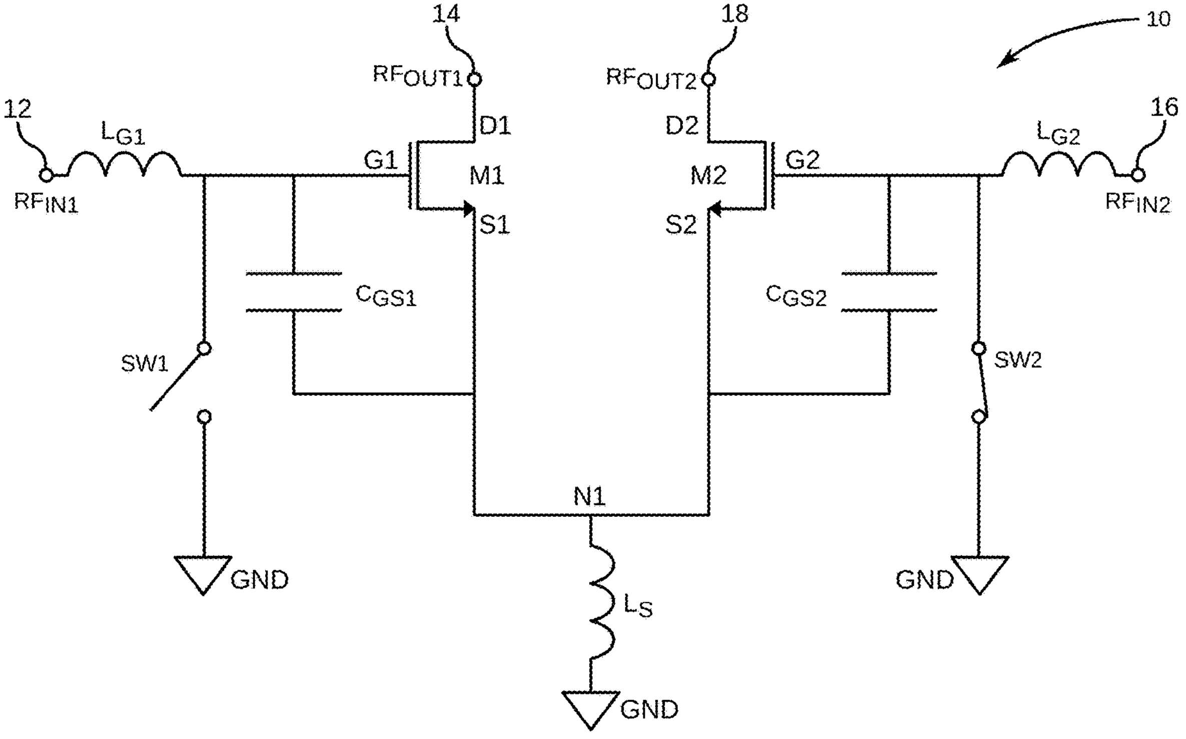
FIG. 1 is a related-art schematic diagram showing two common source stages sharing one degeneration inductor topology.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term “and/or” includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

In related-art low-noise amplifiers (LNAs) fabricated in silicon-on-insulator (SOI), a common source degeneration inductor ($L_S$) is shared among different bands to save layout area, as shown in a related-art LNA 10 depicted in FIG. 1. The related-art LNA 10 includes a first transistor M1 and a second transistor M2, where only one of the first transistor M1 and the second transistor M2 may be actively amplifying a radio frequency (RF) signal at any given time.

As depicted in FIG. 1, the first transistor M1 has a first gate G1 coupled to a first RF input terminal 12 labeled $RF_{IN1}$. A first gate inductor $L_{G1}$ is coupled between the first RF input terminal 12 and the first gate G1. The first transistor M1 also has a first drain D1 coupled to a first output terminal 14 labeled $RF_{OUT1}$ and a first source 16 coupled to a common node N1. The second transistor M2 has a second gate G2 coupled to a second RF input terminal 16 labeled $RF_{IN2}$. A second gate inductor $L_{G2}$ may be coupled between the second gate G2 and the second RF input terminal 16. The second transistor M2 also has a second drain D2 coupled to a second output terminal 18 labeled $RF_{OUT2}$ and a second source S2 coupled to the common node N1. The source inductor $L_S$ is coupled between the common node N1 and ground GND.

To improve noise figure performance and make input matching easier with noise figure and gain trade-offs, a first capacitor $C_{GS1}$ is coupled between the first gate G1 and the first source S1, and a second capacitor $C_{GS2}$ is coupled between the second gate G2 and the second source S2. The first capacitor $C_{GS1}$ and the second capacitor $C_{GS2}$ also improve flatness of in-band gain and noise figure ripple to meet desired specifications. The first capacitor $C_{GS1}$ and the second capacitor $C_{GS2}$ each typically have a capacitance of 150 pF±10%. In some embodiments, the first capacitor $C_{GS1}$ and the second capacitor $C_{GS2}$ each have a capacitance of between 100 pF and 200 pF.

A first grounding switch SW1 is coupled between the first gate G1 and ground GND, and a second grounding switch SW2 is coupled between the second gate G2 and ground GND. During operation, when the first transistor M1 is actively amplifying an RF signal arriving at the first RF input terminal 12, the first grounding switch SW1 is open. Concurrently, the second transistor M2 is in an OFF-state and is not actively amplifying any signals arriving at the second RF input terminal 16. The second grounding switch SW2 is closed when the second transistor M2 is OFF. In this configuration, the common node N1 looking toward the second source S2 sees the second capacitor $C_{GS2}$ in parallel with OFF-state gate-source capacitance of the second transistor M2 connected to ground GND. The result of this effectively couples a capacitive component in parallel with common source inductor $L_S$ to ground. Depending on the selection of size of the second transistor M2 and capacitance and inductance values, there is potential for instability at high frequency when a network at the source S1 of the first transistor M1 becomes capacitive and presents an impedance with a negative real part at the gate G1 of the first transistor M1.

Figure 2:
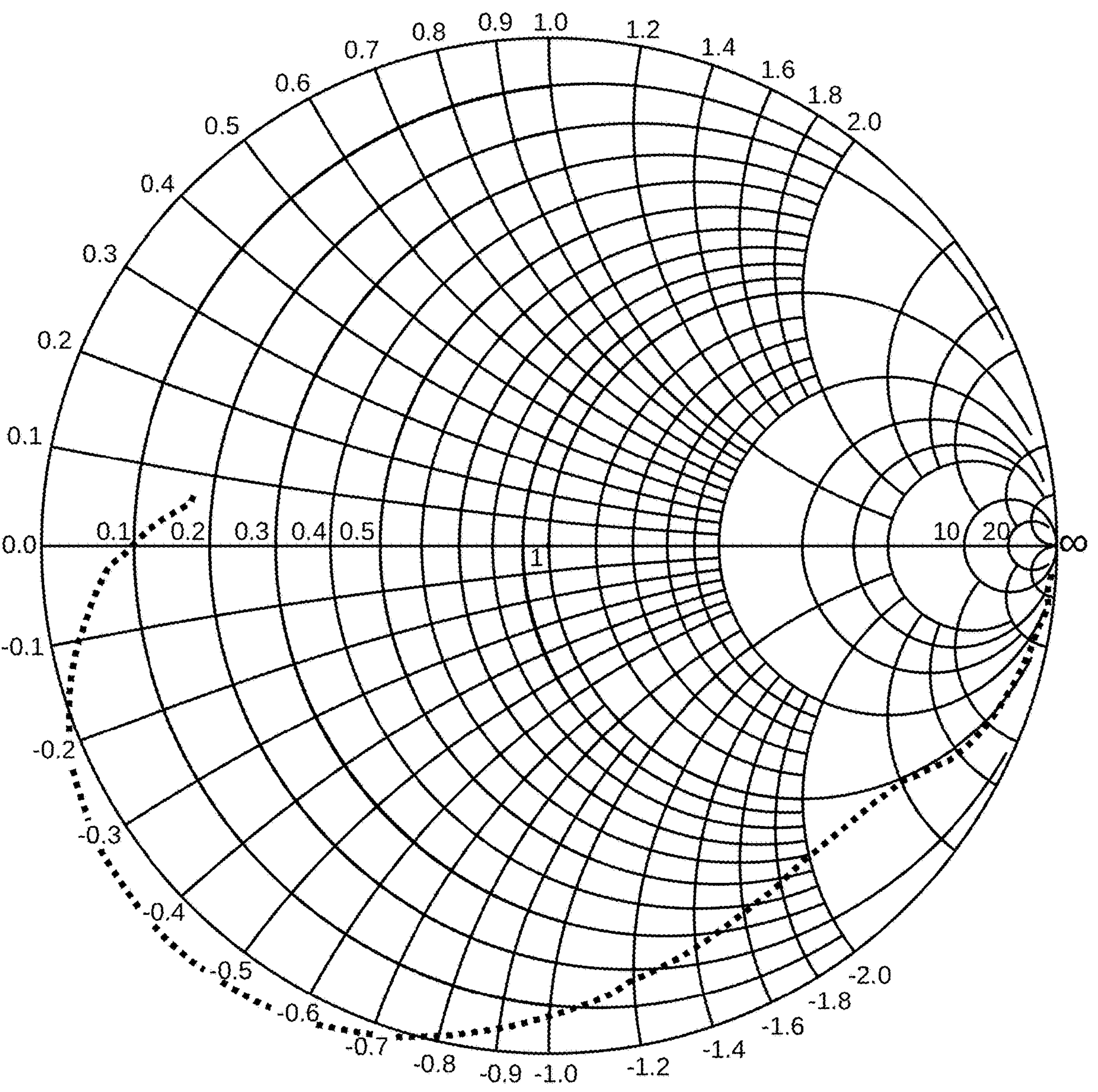
FIG. 2 is a Smith chart showing a portion of the scattering parameter S11 of the first transistor outside the unity circle of the Smith chart between 10 GHz and 17.5 GHz.

A k-factor, also known as the Rollett stability factor, is a parameter used to determine the unconditional stability of an active two-port network or amplifier such as LNA 10. A k-factor stability check shows that at these frequencies that are usually between 10 GHz and 20 GHz, the k-factor will be below 1, and the scattering parameter S11 of the first transistor M1 will be outside the unity circle of the Smith chart as shown in FIG. 2. The RF amplifier 10 with instability has been verified in measurement that under highest bias and lowest temperature of −30° C., a spur at around 21 GHz can be observed for one of the variants in the related-art RF amplifier 10 configured as depicted in FIG. 1.

Figure 3:
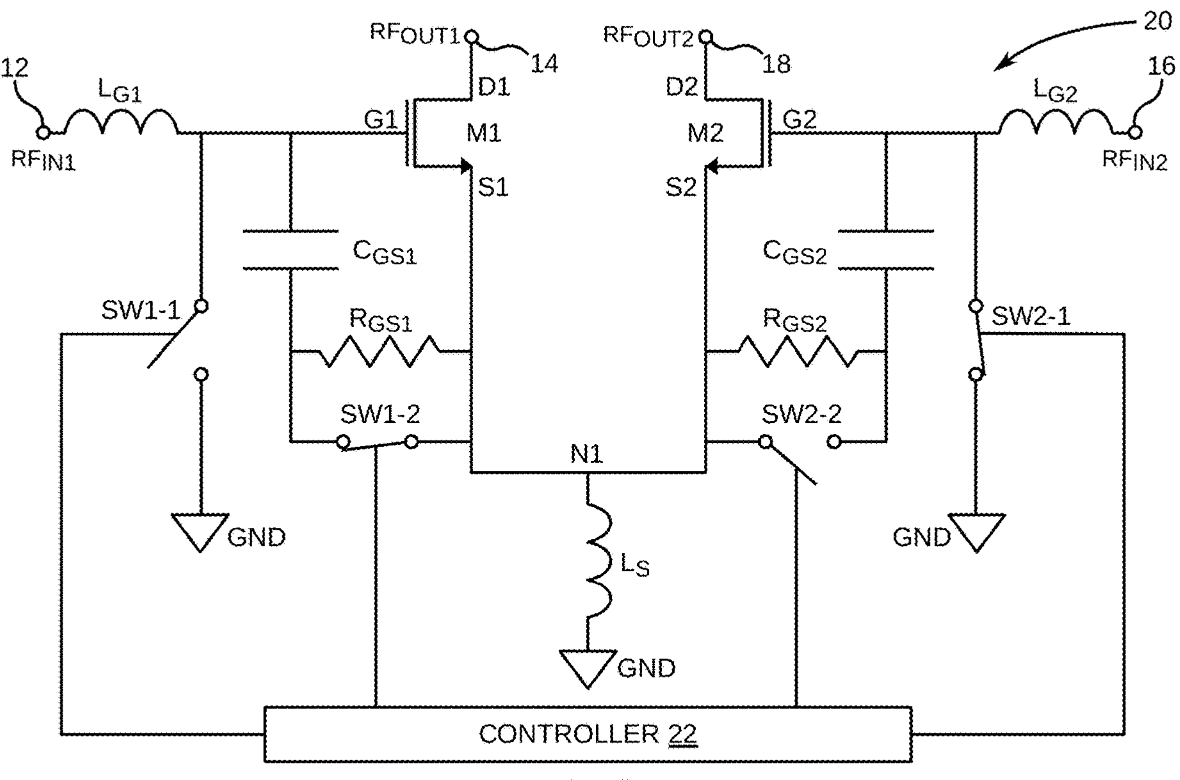
FIG. 3 is a schematic diagram showing the introduction of gate-to-source resistors coupled to parallel switches and under the control of a controller to improve stability without degrading noise figure.

FIG. 3 is a schematic of an embodiment of an RF amplifier 20 that is configured in accordance with the present disclosure to address the instability issue and issues related to process (P), voltage (V), and temperature (T) variations that may affect the stability of RF circuits. For example, manufacturing tolerances may cause variations in transistor characteristics and passive component values, while fluctuations in supply voltage can alter transistor biasing, affecting gain and phase behavior at higher frequencies. Additionally, changes in operating temperatures can lead to resistance drifts and parameter shifts in transistors, further contributing to instability. Shunt switches play a crucial role in reducing thermal noise in RF amplifiers by bypassing resistors when amplification is unnecessary, thus lowering their contribution to noise during the transistor's off-state. By closing these switches, the resistor's impedance is effectively removed from the circuit path, thereby minimizing its impact on the amplifier's noise figure and ensuring that any noise generated does not degrade performance when no signal is being amplified. Under certain PVT conditions, the gate impedance of a transistor may become negatively reactive, leading to potential oscillations or poor stability, particularly above 10 GHz. To mitigate these issues, series-connected capacitor-resistor combinations and controlled shunt switches are introduced to maintain the scattering parameter S11 within the unity circle on the Smith chart across all operating frequencies. In this regard, a first resistor $R_{GS1}$ is coupled in series with the first capacitor $C_{GS1}$ between the first gate G1 and the first source S1. A second resistor $R_{GS2}$ is coupled in series with the second capacitor $C_{GS2}$ between the second gate G2 and the second source S2. Both of these resistor-capacitor series combinations are provided to maintain the scattering parameter S11 within the unity circle on the Smith chart whenever either of the first transistor M1 or the second transistor M2 is amplifying an RF signal. Proper selection of the resistances and capacitances of the series-connected combination of the first capacitor $C_{GS1}$ and the first resistor $R_{GS1}$ and the series-connected combination of the second capacitor $C_{GS2}$ and the second resistor $R_{GS2}$ maintains stability across all operating frequency ranges. The resistances of the first resistor $R_{GS1}$ and the second resistor $R_{GS2}$ are each typically 50Ω+5%, which degrades the minimum noise figure by about 0.15 dB. In some embodiments, the first resistor $R_{GS1}$ and the second resistor $R_{GS2}$ each have a resistance between 25Ω and 75Ω.

As shown in FIG. 3, the RF amplifier 20, like the related-art RF amplifier 10 (FIG. 1), has a first grounding switch SW1-1 coupled between the first gate G1 to ground GND, and a second grounding switch SW2-1 coupled between the second gate G2 and ground. Additionally, to address the degradation of the minimum noise figure, a first shunting switch SW1-2 is coupled in parallel with the first resistor $R_{GS1}$, and a second shunting switch SW2-2 is coupled in parallel with the second resistor $R_{GS2}$.

A controller 22 is configured to generate grounding control signals for the first grounding switch SW1-1 and the second grounding switch SW2-1. The controller 22 is also configured to generate shunting signals for the first shunting switch SW1-2 and the second shunting switch SW2-2. The controller 22 is responsible for managing the state of shunt and grounding switches, ensuring that only one of the transistors is active at any given time. This coordination prevents interference or instability caused by simultaneous operation.

Through this configuration, the RF amplifier effectively addresses noise figure degradation and high-frequency stability concerns, maintaining optimal performance across varying conditions while minimizing unnecessary noise contributions. The controller 22 may be realized in digital logic, a state machine, and/or a digital processor.

As further shown in FIG. 3, when the first transistor M1 is ON while amplifying an RF signal arriving at the first RF input terminal 12, the second transistor M2 is OFF, the first shunting switch SW1-2 is closed, and the second shunting switch SW2-2 is open. To arrive at the switch states depicted in FIG. 3, the first shunting switch SW1-2 was closed, and the second shunting switch SW2-2 was opened by commands of the shunting signals generated by the controller 22. In the configuration shown in FIG. 3, the impact of noise figure due to the thermal noise generated by the first resistor $R_{GS1}$ is minimized by the shunting current through the first shunting switch SW1-2 and around the first resistor $R_{GS1}$. The shunting action is substantial due to a much smaller ON-state resistance (Ron) of the first shunting switch SW1-2 relative to the resistance of the first resistor $R_{GS1}$.

While the second transistor M2 is OFF, the second switch SW2-2 is open so that the second resistor $R_{GS2}$ remains in series with the second capacitor $C_{GS2}$ to provide improved stability. Because the resistance of the second resistor $R_{GS2}$ is relatively much higher than the impedance of $L_s$ and in parallel effectively, the impact of the second resistor $R_{GS2}$ to in-band noise figure is negligible at in-band frequencies.

Figure 4:
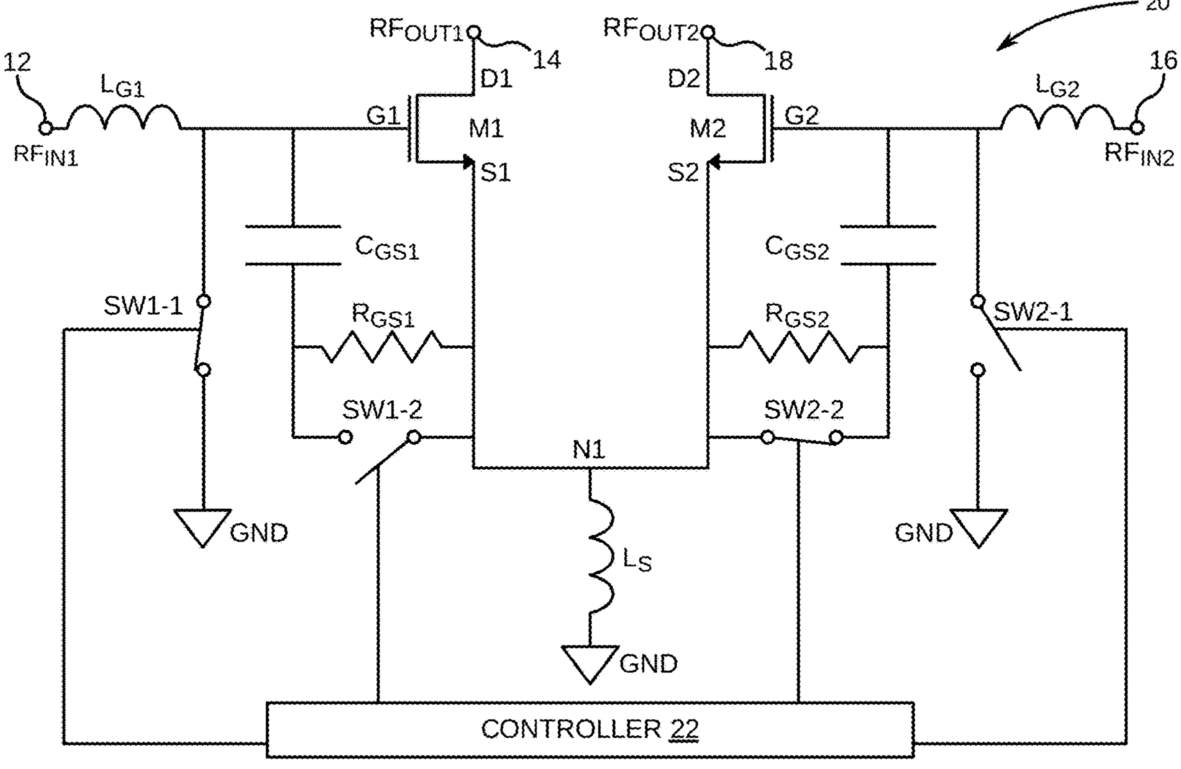
FIG. 4 is a schematic diagram depicting switch closures under control of the controller showing a selection amplifier opposite of the amplifier selected in FIG. 3.

As shown in FIG. 4, when the second transistor M2 is ON while amplifying an RF signal arriving at the second RF input terminal 16, the first transistor M1 is OFF, the second shunting switch SW2-2 is closed, and the first shunting switch SW2-1 is open. To arrive at the switch states depicted in FIG. 4, the first shunting switch SW1-2 was opened, and the second shunting switch SW2-2 was closed by commands of the shunting signals generated by the controller 22. In the configuration shown in FIG. 4, the impact of noise figure due to the thermal noise generated by the second resistor $R_{GS2}$ is minimized by the shunting current through the second shunting switch SW2-2 and around the second resistor $R_{GS2}$. The shunting is substantial due to a much smaller ON-state Ron of the second shunting switch SW2-2 relative to the resistance of the second resistor $R_{GS2}$.

While the first transistor M1 is OFF, the first shunting switch SW1-2 is open so that the first resistor $R_{GS1}$ remains in series with the first capacitor $C_{GS1}$ to provide improved stability. Because the resistance of the first resistor $R_{GS1}$ is relatively much higher than the impedance of $L_s$ and in parallel effectively, the impact of the first resistor $R_{GS1}$ to in-band noise figure is negligible at in-band frequencies.

Figure 5:
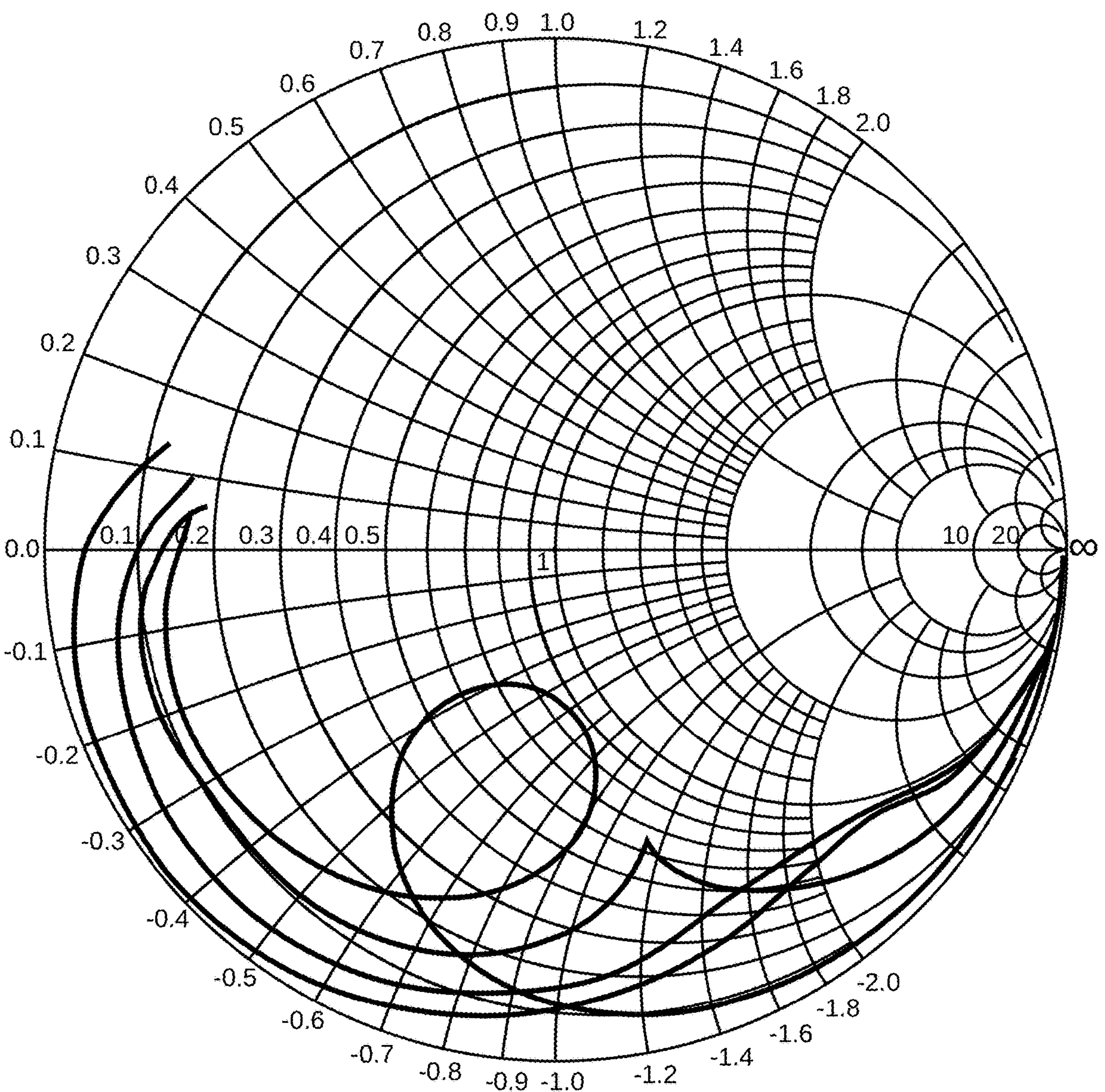
FIG. 5 is a Smith chart showing the S11 of the RF amplifier disclosed in FIGS. 3 and 4 over process, voltage, and temperature variations in which stability is maintained for all bands of operation.

FIG. 5 is a diagram of Smith chart with plotted results of a simulation of the RF amplifier 20 showing that stability is maintained over process, voltage, and temperature variations. Moreover, a minimum noise figure of the RF amplifier 20 is improved by a reduction of at least 0.15 dB.

Figure 6:
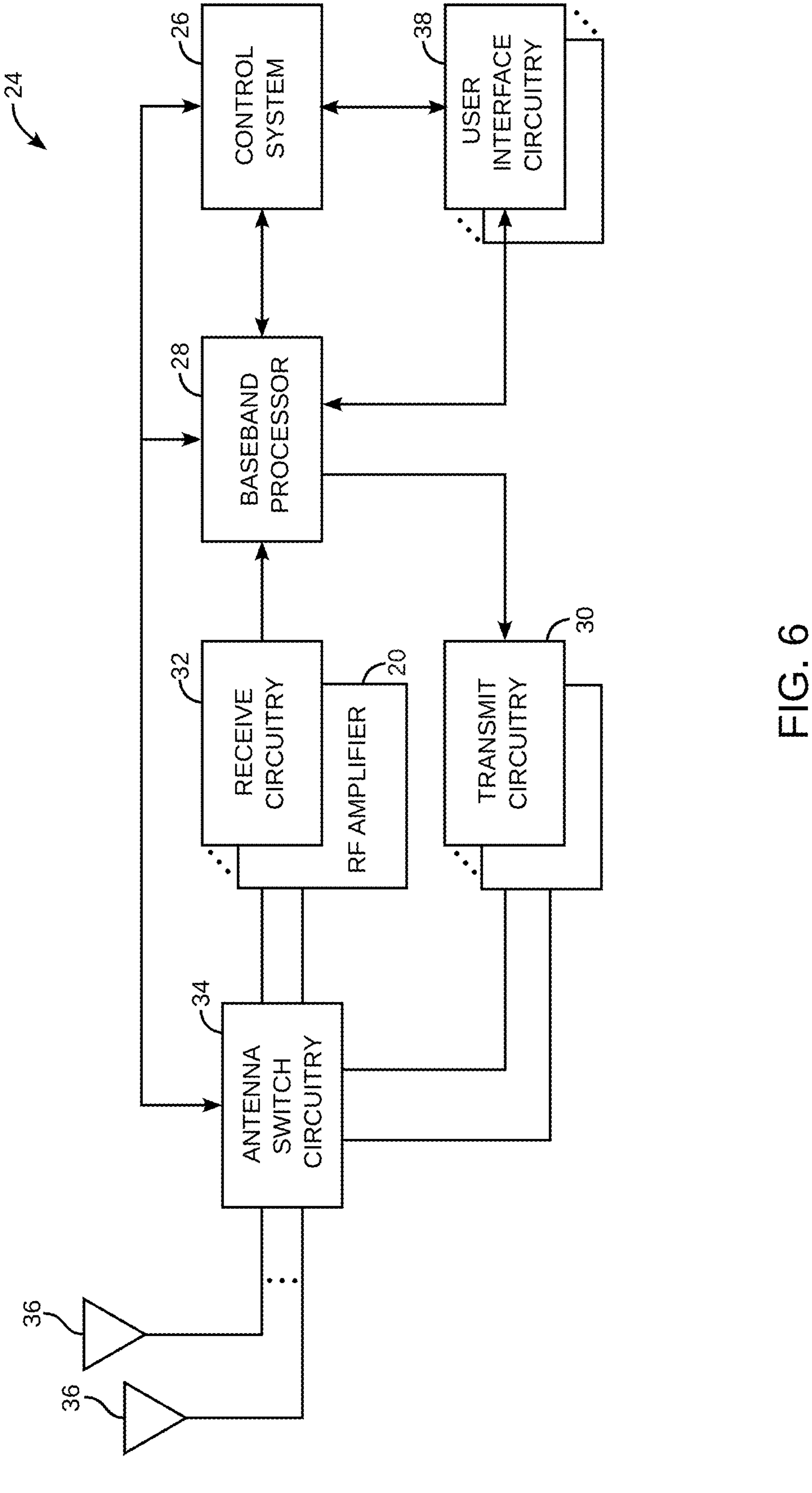
FIG. 6 is a block diagram of a wireless communication device that employs embodiments of the RF amplifier of the present disclosure.

With reference to FIG. 6, the concepts described above may be implemented in various types of wireless communication devices or user elements 24, such as mobile terminals, smart watches, tablets, computers, navigation devices, access points, and the like that support wireless communications, such as cellular, wireless local area network (WLAN), Bluetooth, and near-field communications. The user elements 24 will generally include a control system 26, a baseband processor 28, transmit circuitry 30, receive circuitry 32 that includes the RF amplifier 20 (FIGS. 3 and 4), antenna switching circuitry 34, multiple antennas 36, and user interface circuitry 38. The receive circuitry 32 receives radio frequency signals via the antennas 36 and through the antenna switching circuitry 34 from one or more basestations. The RF amplifier and a filter (not shown) cooperate to amplify and remove broadband interference from the received signal for processing. Downconversion and digitization circuitry (not shown) then downconvert the filtered, received signal to an intermediate or baseband frequency signal, which is then digitized into one or more digital streams.

The baseband processor 28 processes the digitized received signal to extract the information or data bits conveyed in the received signal. This processing typically comprises demodulation, decoding, and error correction operations. The baseband processor 28 is generally implemented in one or more digital signal processors (DSPs) and application-specific integrated circuits (ASICs).

For transmission, the baseband processor 28 receives digitized data, which may represent voice, data, or control information, from control system 26, which it encodes for transmission. The encoded data are output to the transmit circuitry 30, where they are used by a modulator (not shown) to modulate a carrier signal that is at a desired transmit frequency or frequencies. A power amplifier (not shown) amplifies the modulated carrier signal to a level appropriate for transmission and delivers the modulated carrier signal to the antennas 36 through the antenna switching circuitry 34. The antennas 36 and the replicated transmit circuitry 30 and receive circuitry 32 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency amplifier comprising:

a first transistor having a first drain connected to a first output terminal, a first source coupled to a common node, and a first gate linked to a first radio frequency (RF) input;

a series-connected combination of a first capacitor and a first resistor between the first gate and the first source;

a first shunt switch coupled in parallel with the first resistor and controlled by a first shunting control signal;

a first grounding switch coupled between the first gate and ground, controlled by a first grounding control signal; and a controller configured to:

select an on-state for the first transistor by generating the first grounding control signal to command the first grounding switch into an open-state, enabling amplification of an RF signal at the first input, and concurrently generate the first shunting control signal to command the first shunting switch into a closed-state; and select an off-state for the first transistor by generating the first grounding control signal to command the first grounding switch into a closed-state, thereby preventing amplification of RF signals at the first input, and generating the first shunting control signal to command the first shunting switch into an open-state.

2. The RF amplifier of claim 1 further comprising:

a second transistor having a second drain connected to a second output terminal, a second source coupled to the common node, and a second gate linked to a second RF input;

a series-connected combination of a second capacitor and a second resistor between the second gate and the second source;

a second shunt switch coupled in parallel with the second resistor and controlled by a second shunting control signal;

a second grounding switch coupled between the second gate and ground, controlled by a second grounding control signal, and wherein the controller is further configured to:

select an on-state for the second transistor by generating the second grounding control signal to command the second grounding switch into an open-state, enabling amplification of an RF signal at the second input, and concurrently generate the second shunting control signal to command the second shunting switch into a closed-state; and select an off-state for the second transistor by generating the second grounding control signal to command the second grounding switch into a closed-state, thereby preventing amplification of RF signals at the second input and generating the second shunting control signal to command the second shunting switch into an open-state.

3. The RF amplifier of claim 2 wherein the controller is further configured to generate the control signals such that neither of the first transistor and the second transistor are in an on-state simultaneously.

4. The RF amplifier of claim 1 further comprising a source inductor coupled between the common node and ground.

5. The RF amplifier of claim 1 further comprising a first gate inductor coupled between the first gate and the first input.

6. The RF amplifier of claim 2 further comprising a second gate inductor coupled between the second gate and the second input.

7. The RF amplifier of claim 2 wherein the first resistor and the second resistor each have a resistance between 25Ω and 75Ω.

8. The RF amplifier of claim 2 wherein the first resistor and the second resistor each have a resistance of 50Ω±5%.

9. The RF amplifier of claim 2 wherein the first capacitor and the second capacitor each have a capacitance between 100 pF and 200 pF.

10. The RF amplifier of claim 2 wherein the first capacitor and the second capacitor each have a capacitance of 150 pF±10%.

11. A method of controlling a radio frequency amplifier having a first transistor with a first drain coupled to a first output terminal, a first source coupled to a common node, and a first gate coupled to a first radio frequency (RF) input, a series-connected combination of a first capacitor and a first resistor between the first gate and the first source, a first shunt switch coupled in parallel with the first resistor and controlled by a first shunting control signal, a first grounding switch coupled between the first gate and ground, controlled by a first grounding control signal and a controller configured to generate the first grounding control signal and the first shunting control signal, the method comprising:

selecting an on-state for the first transistor by generating the first grounding control signal to command the first grounding switch into an open-state, enabling amplification of an RF signal at the first input, and concurrently generating the first shunting control signal to command the first shunting switch into a closed-state; and selecting an off-state for the first transistor by generating the first grounding control signal to command the first grounding switch into a closed-state, thereby preventing amplification of RF signals at the first input, and generating the first shunting control signal to command the first shunting switch into an open-state.

12. The method of controlling the radio frequency amplifier of claim 11 further having a second transistor with a second drain coupled to a second output terminal, a second source coupled to the common node, and a second gate coupled to a second radio frequency (RF) input, a series-connected combination of a second capacitor and a second resistor between the second gate and the second source, a second shunt switch coupled in parallel with the second resistor and controlled by a second shunting control signal, a second grounding switch coupled between the second gate and ground, controlled by a second grounding control signal, wherein the controller is configured to generate the second grounding control signal and the second shunting control signal, the method comprising:

selecting an on-state for the second transistor by generating the second grounding control signal to command the second grounding switch into an open-state, enabling amplification of an RF signal at the second input, and concurrently generating the second shunting control signal to command the second shunting switch into a closed-state; and selecting an off-state for the second transistor by generating the second grounding control signal to command the second grounding switch into a closed-state, thereby preventing amplification of RF signals at the second input and generating the second shunting control signal to command the second shunting switch into an open-state.

13. The method of controlling the RF amplifier of claim 12 further comprising generating by the controller the control signals such that neither of the first transistor and the second transistor are in an on-state simultaneously.

14. The method of controlling the RF amplifier of claim 11 further comprising a source inductor coupled between the common node and ground.

15. The method of controlling the RF amplifier of claim 11 further comprising a first gate inductor coupled between the first gate and the first input.

16. The method of controlling the RF amplifier of claim 12 further comprising a second gate inductor coupled between the second gate and the second input.

17. The method of controlling the RF amplifier of claim 12 wherein the first resistor and the second resistor each have a resistance between 25Ω and 75Ω.

18. The method of controlling the amplifier of claim 12 wherein the first resistor and the second resistor each have a resistance of 50Ω±5%.

19. The method of controlling the RF amplifier of claim 12 wherein the first capacitor and the second capacitor each have a capacitance between 100 pF and 200 pF.

20. The RF amplifier of claim 12 wherein the first capacitor and the second capacitor each have a capacitance of 150 pF±10%.

21. A wireless communication device comprising:

receive circuitry configured to receive radio frequency (RF) signals;

a baseband processor configured to process a digitized version of the RF signals received by the receive circuitry and to extract the information or data bits conveyed in the received RF signals;

transmit circuitry configured to receive encoded data from the baseband processor and to modulate a carrier signal with the encoded data; and a radio frequency (RF) amplifier coupled to the transmit circuitry, the RF amplifier comprising:

a first transistor having a first drain connected to a first output terminal, a first source coupled to a common node, and a first gate linked to a first radio frequency (RF) input;

a series-connected combination of a first capacitor and a first resistor between the first gate and the first source;

a first shunt switch coupled in parallel with the first resistor and controlled by a first shunting control signal;

a first grounding switch coupled between the first gate and ground, controlled by a first grounding control signal; and a controller configured to:

select an on-state for the first transistor by generating the first grounding control signal to command the first grounding switch into an open-state, enabling amplification of an RF signal at the first input, and concurrently generate the first shunting control signal to command the first shunting switch into a closed-state; and select an off-state for the first transistor by generating the first grounding control signal to command the first grounding switch into a closed-state, thereby preventing amplification of RF signals at the first input, and generating the first shunting control signal to command the first shunting switch into an open-state.

22. The wireless communication device of claim 21 wherein the RF amplifier further comprises:

a second transistor having a second drain connected to a second output terminal, a second source coupled to the common node, and a second gate linked to a second RF input;

a series-connected combination of a second capacitor and a second resistor between the second gate and the second source;

a second shunt switch coupled in parallel with the second resistor and controlled by a second shunting control signal;

a second grounding switch coupled between the second gate and ground, controlled by a second grounding control signal, and wherein the controller is further configured to:

select an on-state for the second transistor by generating the second grounding control signal to command the second grounding switch into an open-state, enabling amplification of an RF signal at the second input, and concurrently generate the second shunting control signal to command the second shunting switch into a closed-state; and select an off-state for the second transistor by generating the second grounding control signal to command the second grounding switch into a closed-state, thereby preventing amplification of RF signals at the second input and generating the second shunting control signal to command the second shunting switch into an open-state.

23. The wireless communication device of claim 22 wherein the controller of the RF amplifier is further configured to generate the control signals such that neither of the first transistor and the second transistor are in an on-state simultaneously.

24. The wireless communication device of claim 21 wherein the RF amplifier further comprises a source inductor coupled between the common node and ground.

25. The wireless communication device of claim 21 wherein the RF amplifier further comprises a first gate inductor coupled between the first gate and the first input.

26. The wireless communication device of claim 22 wherein the RF amplifier further comprises a second gate inductor coupled between the second gate and the second input.

27. The wireless communication device of claim 22 wherein the first resistor and the second resistor of the RF amplifier each have a resistance between 25Ω and 75Ω.

28. The wireless communication device of claim 22 wherein the first resistor and the second resistor of the RF amplifier each have a resistance of 50Ω±5%.

29. The wireless communication device of claim 22 wherein the first capacitor and the second capacitor each have a capacitance between 100 pF and 200 pF.

30. The wireless communication device of claim 22 wherein the first capacitor and the second capacitor each have a capacitance of 150 pF±10%.

* * * * *